United States Patent
Kim et al.

(10) Patent No.: US 10,778,347 B2
(45) Date of Patent: Sep. 15, 2020

(54) VEHICLE COMMUNICATION APPARATUS AND VEHICLE

(71) Applicant: LG Electronics Inc., Seoul (KR)

(72) Inventors: Heejin Kim, Seoul (KR); Jiwon Kang, Seoul (KR); Sunam Kim, Seoul (KR); Hanbyul Seo, Seoul (KR); Sangwook Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/329,884

(22) PCT Filed: Jul. 25, 2017

(86) PCT No.: PCT/KR2017/007974
§ 371 (c)(1),
(2) Date: Mar. 1, 2019

(87) PCT Pub. No.: WO2018/021788
PCT Pub. Date: Feb. 1, 2018

(65) Prior Publication Data
US 2019/0273567 A1 Sep. 5, 2019

Related U.S. Application Data

(60) Provisional application No. 62/367,769, filed on Jul. 28, 2016.

(51) Int. Cl.
*H04B 17/21* (2015.01)
*H04B 17/318* (2015.01)
(Continued)

(52) U.S. Cl.
CPC ........... *H04B 17/21* (2015.01); *H01Q 1/3291* (2013.01); *H03L 7/093* (2013.01); *H03M 1/66* (2013.01);
(Continued)

(58) Field of Classification Search
CPC combination set(s) only.
See application file for complete search history.

(56) References Cited

U.S. PATENT DOCUMENTS

2006/0104394 A1* 5/2006 Chan ........................ H03J 7/00
375/344
2006/0284769 A1 12/2006 Bolduc et al.
(Continued)

FOREIGN PATENT DOCUMENTS

WO  WO2010105210  9/2010

OTHER PUBLICATIONS

Extended European Search Report in European Application No. 17834730.8, dated Feb. 5, 2020, 8 pages.
(Continued)

*Primary Examiner* — Junpeng Chen
(74) *Attorney, Agent, or Firm* — Fish & Richardson P.C.

(57) ABSTRACT

A vehicle communication apparatus includes a plurality of remote units (RUs) configured to transmit signals to a mobile communication network and to receive signals from the mobile communication network, and a central unit (CU) configured to provide data based on the signals received through the plurality of remote units to one or more devices located in a vehicle. The plurality of remote units includes an array antenna attached to a body of the vehicle.

19 Claims, 9 Drawing Sheets

(51) Int. Cl.
*H04W 4/44* (2018.01)
*H01Q 1/32* (2006.01)
*H03L 7/093* (2006.01)
*H03M 1/66* (2006.01)
*H04B 7/04* (2017.01)
*H04W 88/08* (2009.01)

(52) U.S. Cl.
CPC .............. *H04B 7/04* (2013.01); *H04B 17/318* (2015.01); *H04W 4/44* (2018.02); *H04W 88/08* (2013.01)

(56) References Cited

U.S. PATENT DOCUMENTS

| | | | | |
|---|---|---|---|---|
| 2007/0104298 | A1* | 5/2007 | Filipovic | H03J 7/10 375/344 |
| 2009/0058536 | A1 | 3/2009 | Gomez | |
| 2009/0170537 | A1* | 7/2009 | Mauti, Jr. | H04L 67/06 455/466 |
| 2010/0234071 | A1 | 9/2010 | Shabtay et al. | |
| 2011/0140778 | A1* | 6/2011 | Cho | H03G 3/3078 330/129 |
| 2013/0103779 | A1* | 4/2013 | Bai | H04L 67/2833 709/213 |
| 2014/0288774 | A1* | 9/2014 | Morita | G01C 21/26 701/36 |
| 2014/0327301 | A1 | 11/2014 | Iizuka et al. | |
| 2016/0064805 | A1* | 3/2016 | Petrucci | H04W 88/08 343/713 |
| 2017/0238346 | A1* | 8/2017 | Egner | H04W 4/029 370/338 |

OTHER PUBLICATIONS

United States Office Action in U.S. Appl. No. 16/568,851, dated Dec. 30, 2019, 12 pages.

* cited by examiner

VEHICLE COMMUNICATION APPARATUS AND VEHICLE

CROSS-REFERENCE TO RELATED APPLICATIONS

This application is a National Stage application under 35 U.S.C. § 371 of International Application No. PCT/KR2017/007974, filed on Jul. 25, 2017, which claims the benefit of U.S. Provisional Application No. 62/367,769, filed on Jul. 28, 2016. The disclosures of the prior applications are incorporated by reference in their entirety.

TECHNICAL FIELD

The present invention relates to a vehicle communication apparatus and a vehicle.

BACKGROUND ART

A vehicle refers to an apparatus moved by a user in a desired direction and representative examples thereof include automobiles.

As the frequency of use of wireless communication of a passenger in a vehicle increases and the number of categories of services using wireless communication increases, it is necessary to provide a high data rate and high quality of service (QoS) to users at a high speed unlike the related art.

For example, when a plurality of users using public transportation wants to view multimedia content or a plurality of passengers in a private vehicle traveling on a highway uses different mobile communication systems, a mobile communication system needs to provide good wireless services to the users.

According to such necessity, an array antenna having a large size is required. However, due to the aerodynamic structure and exterior design of a vehicle, it is difficult to attach a large array antenna to the vehicle.

DISCLOSURE

Technical Problem

Accordingly, an object of the present invention is to provide a communication apparatus capable of providing good wireless services.

In addition, another object of the present invention is to provide a vehicle including the communication apparatus.

The technical problems solved by the present invention are not limited to the above technical problems and other technical problems which are not described herein will become apparent to those skilled in the art from the following description.

Technical Solution

According to an aspect of the present invention, a vehicle communication apparatus includes a plurality of remote units (RUs) configured to transmit signals to a mobile communication network and to receive signals from the mobile communication network, and a central unit (CU) configured to provide data based on the signals received through the plurality of remote units to one or more devices located in a vehicle. The plurality of remote units includes an array antenna attached to a body of the vehicle.

The details of other embodiments are included in the detailed description and drawings.

Advantageous Effects

The embodiments of the present invention include one or more of the following effects.

First, it is possible to prevent communication performance deterioration due to penetration loss having an average value of about 20 dB.

Second, it is possible to obtain large array again by using a larger number of antennas than a personal portable communication device.

Third, it is easy to secure a distance between antennas and to secure diversity.

Fourth, it is possible to provide an excellent communication service as compared to a personal portable device without additional investment in infrastructure.

The effects of the present invention are not limited to the above-described effects and other effects which are not described herein may be derived by those skilled in the art from the following description of the embodiments of the present invention.

BEST MODE

Exemplary embodiments of the present invention will be described below in detail with reference to the accompanying drawings in which the same reference numbers are used throughout this specification to refer to the same or like parts and a repeated description thereof will be omitted. The suffixes "module" and "unit" of elements herein are used for convenience of description and thus can be used interchangeably and do not have any distinguishable meanings or functions. In describing the present invention, a detailed description of known functions and configurations will be omitted when it may obscure the subject matter of the present invention. The accompanying drawings are used to help easily understood the technical idea of the present invention and it should be understood that the idea of the present invention is not limited by the accompanying drawings. The idea of the present invention should be construed to extend to any alterations, equivalents and substitutions besides the accompanying drawings.

It will be understood that, although the terms first, second, etc. may be used herein to describe various elements of the present invention, these terms are only used to distinguish one element from another element and essential, order, or sequence of corresponding elements are not limited by these terms.

It will be understood that when one element is referred to as being "connected to" or "coupled to" another element, one element may be "connected to" or "coupled to", another element via a further element although one element may be directly connected to or directly accessed to another element.

A singular representation may include a plural representation unless the context clearly indicates otherwise.

It will be understood that the terms 'comprise', 'include', etc., when used in this specification, specify the presence of several components or several steps and part of the components or steps may not be included or additional components or steps may further be included.

A vehicle as described in this specification may include an automobile and a motorcycle. Hereinafter, an automobile will be focused upon.

A vehicle as described in this specification may include all of a vehicle including an engine as a power source, a hybrid vehicle including both an engine and an electric motor as a power source, and an electric vehicle including an electric motor as a power source.

In the following description, the left of a vehicle means the left of a driving direction of the vehicle, and the right of the vehicle means the right of the driving direction of the vehicle.

Figure 1:
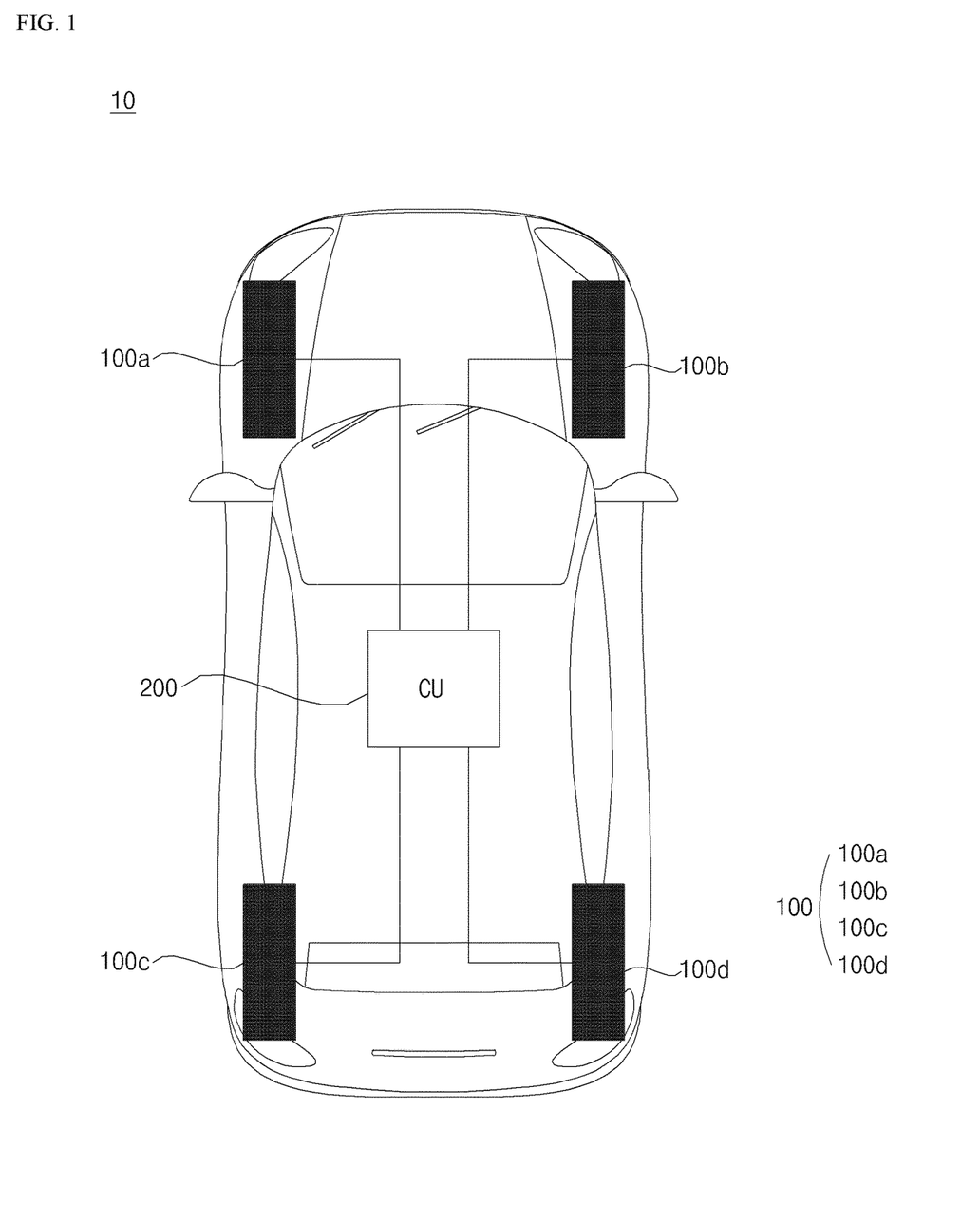
FIG. 1 is a view referenced to describe a communication apparatus provided in a vehicle according to an embodiment of the present invention.

FIG. 1 is a view referenced to describe a communication apparatus provided in a vehicle according to an embodiment of the present invention.

Referring to FIG. 1, the vehicle communication apparatus 10 may include a plurality of remote units (RUs) 100 and a central unit (CU) 200.

The plurality of remote units 100 may be connected to the central unit 200 by wire.

The plurality of remote units 100 may be wirelessly connected to the central unit 200.

The plurality of remote units 100 may be connected to a mobile communication network.

The plurality of remote units 100 may transmit signals to the mobile communication network.

The plurality of remote units 100 may transmit signals to an external device through the mobile communication network. Here, the external device may include at least one of a mobile terminal, a vehicle or a server, which is outside the vehicle.

The plurality of remote units 100 may receive signals from the mobile communication network.

The plurality of remote units 100 may receive signals from the external device through the mobile communication network. Here, the external device may include at least one of a mobile terminal, a vehicle or a server, which is outside the vehicle.

Each of the plurality of remote units 100 may include an array antenna.

The array antenna may be attached to a vehicle body.

The plurality of array antennas may be distributed and disposed on the upper end of the vehicle body.

For example, the array antennas may be distributed and attached to at least one of a hood, a roof, a trunk, a front windshield, a rear windshield or a side mirror.

For example, the array antennas may be attached to at least one of a hood, a roof, a trunk, a front windshield, a rear windshield or a side mirror to face the sky.

For example, the array antennas may be attached to at least one of a hood, a roof, a trunk, a front windshield, a rear windshield or a side mirror to face a side opposite to the ground.

When the array antenna is located at the upper end of the vehicle body, transmission/reception power performance is excellent.

By the plurality of array antennas respectively included in the plurality of remote units 100, it is possible to implement a multiple input multiple output (MIMO) system.

If such a MIMO system is implemented, communication capacity (e.g., communication data capacity) increases.

The plurality of remote units 100 may include a first remote unit 100a, a second remote unit 100b, a third remote unit 100c and a fourth remote unit 100c.

In some embodiments, the plurality of remote units 100 may include two, three or five remote units.

Meanwhile, the plurality of remote units 100 may receive received signals from the same external device through different frequency bands.

For example, the plurality of remote units 100 may include a first remote unit 100a and a second remote unit 100b. The first remote unit 100a may receive a received signal from a first server through a first frequency band. The second remote unit 100b may receive a received signal from the first server through a second frequency band.

Meanwhile, the plurality of remote units 100 may receive received signals from the same external device through different time bands.

For example, the plurality of remote units 100 may include a first remote unit 100a and a second remote unit 100b. The first remote unit 100a may receive a received signal from the first server through a first time band. The second remote unit 100b may receive a received signal from the first server through a second time band.

The central unit 200 may collectively control the plurality of remote units 100.

The central unit 200 may control each of the plurality of remote units 100.

The central unit 200 may be connected to the plurality of remote units 100 by wire.

The central unit 200 may be wirelessly connected to the plurality of remote units 100.

The central unit 200 may provide data based on the received signals received through the plurality of remote units 100 to one or more devices located in the vehicle.

For example, the central unit 200 may provide data based on the signals received through the plurality of remote units 100 to mobile terminals carried by one or more passengers.

The device located in the vehicle may be a mobile terminal located in the vehicle and carried by the passenger.

The device located in the vehicle may be a user interface device provided in the vehicle.

The user interface device is used to communicate between a vehicle and a user. The user interface device may receive user input and provide information generated by the vehicle to the user. The vehicle 100 may implement a user interface (UI) or user experience (UX) through the user interface device.

The user interface device includes a navigation device, an audio video navigation (AVN) device, a center integrated display (CID), a head up display (HUD), etc.

Figure 2:
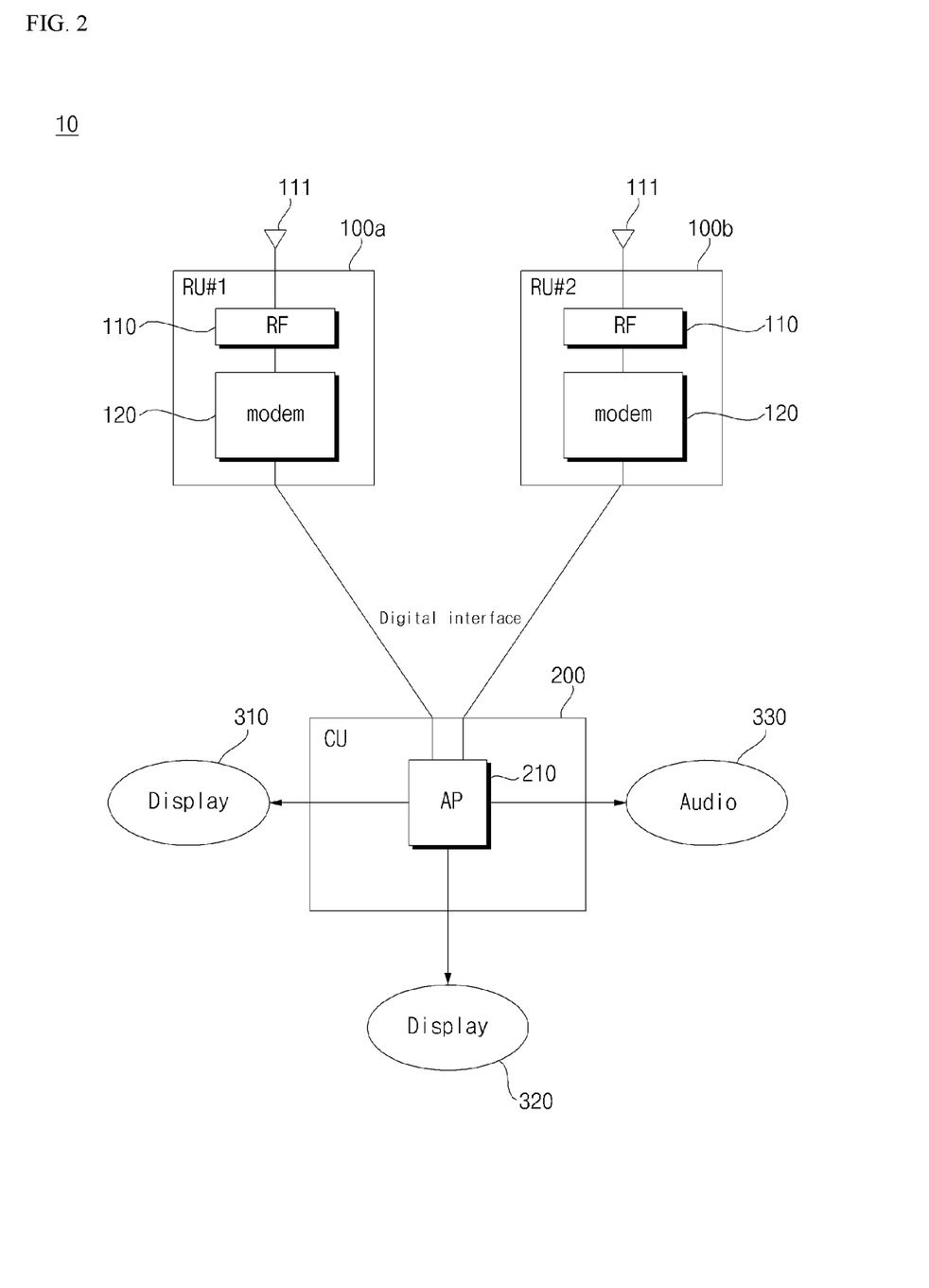
FIGS. 2 to 4 are views referenced to describe a vehicle communication apparatus according to an embodiment of the present invention.
Figure 3:
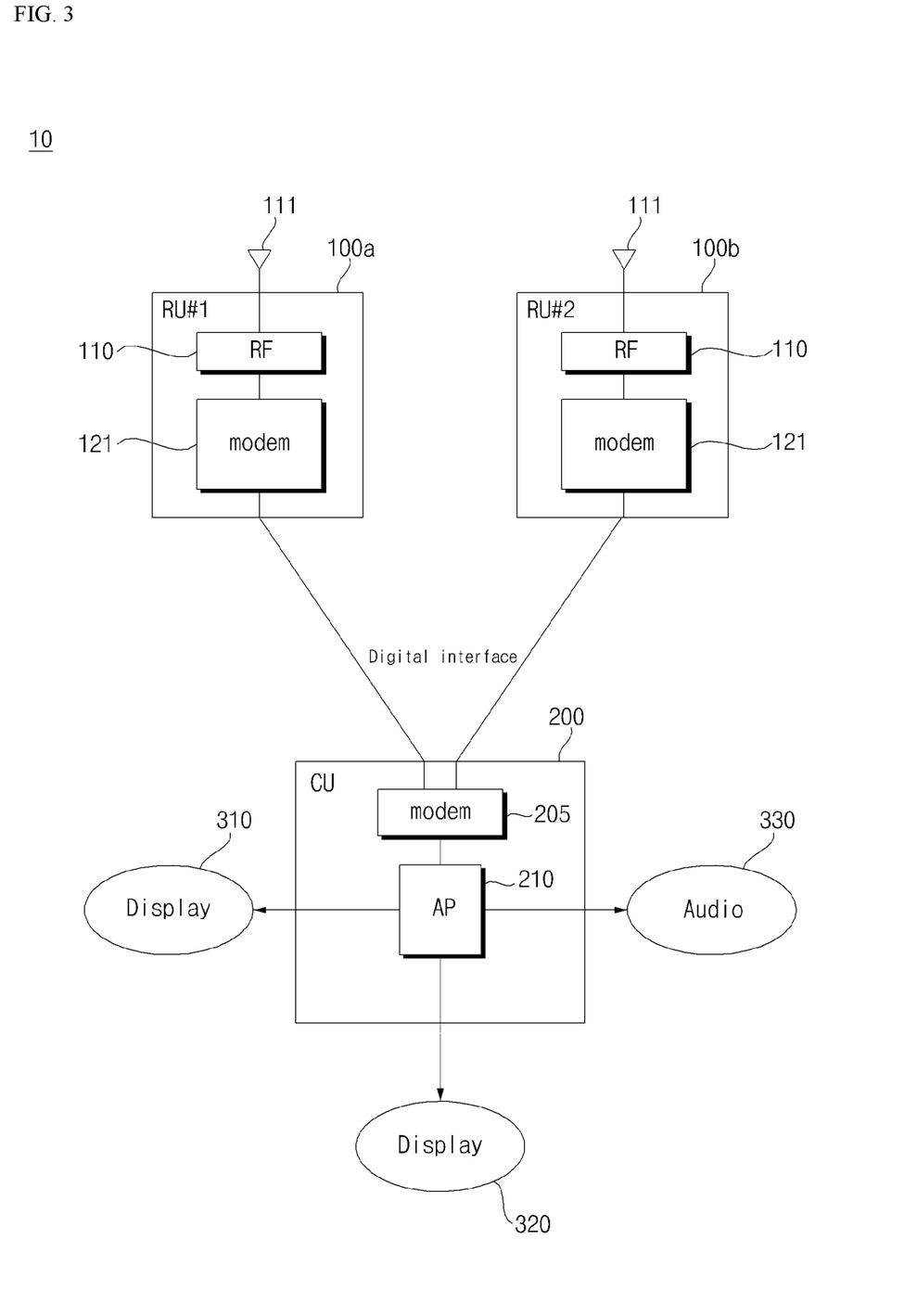
Figure 4:
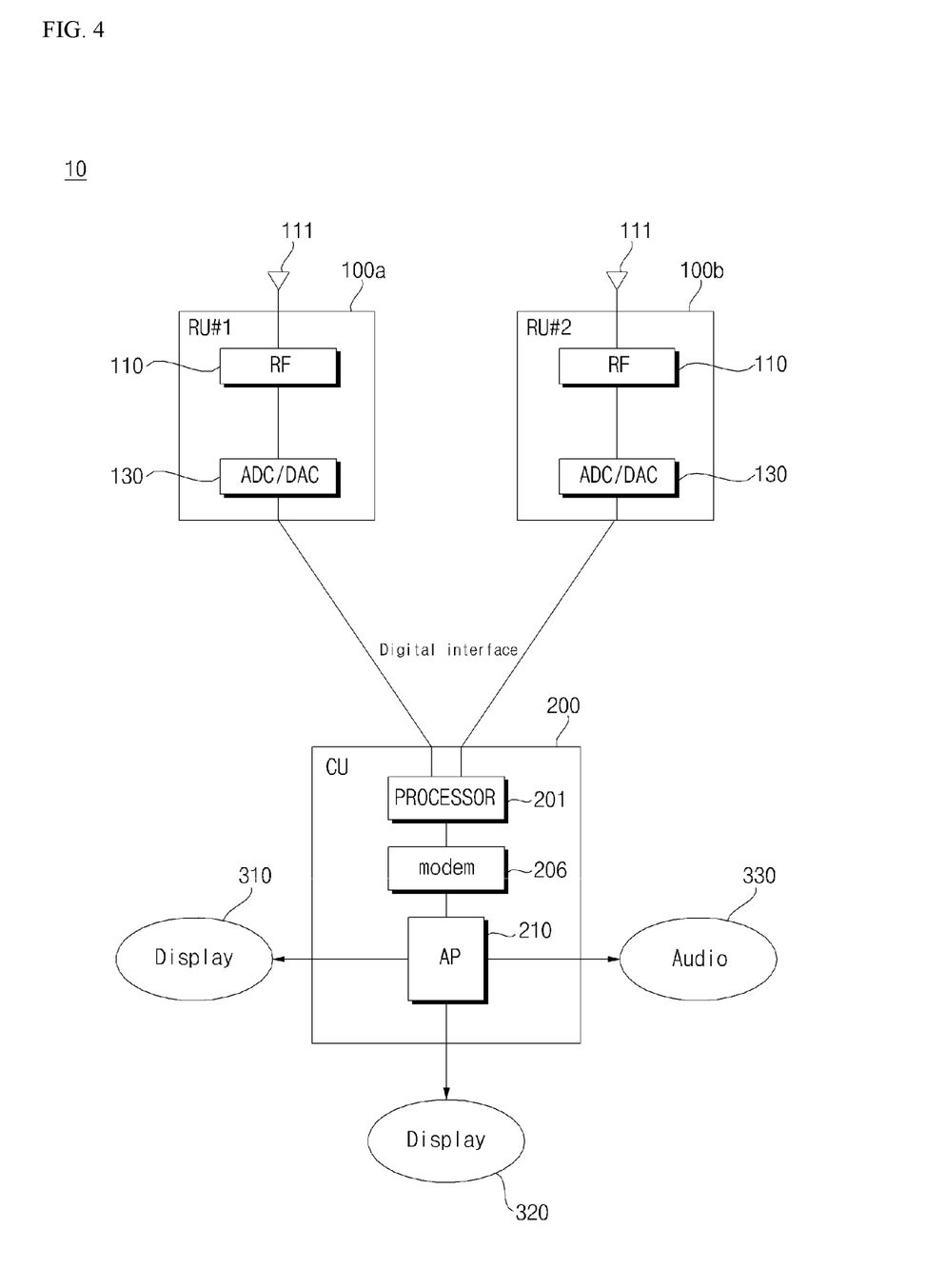

FIGS. 2 to 4 are views referenced to describe a vehicle communication apparatus according to an embodiment of the present invention.

The plurality of remote units 100 and the central unit 200 will be described with reference to FIGS. 2 to 4.

By appropriately distributing and allocating function/layer modules to the remote units 100 and the central unit 200, it is possible to reduce RF implementation difficulty and to obtain implementation gain such as solution of cabling issues between the remote units 100 and the central unit 200.

Referring to FIGS. 2 to 4, each of the plurality of remote units 100 may include a radio frequency (RF) module 110.

The RF module 110 may include an array antenna 111 and an RF circuit capable of implementing a communication protocol.

The array antenna 111 may function as a transmission antenna and a reception antenna.

The RF module 110 may include at least one phase locked loop (PLL) circuit and at least one amplifier.

The PLL circuit may include an oscillator.

The RF module 110 may further include at least one mixer, at least one filter and a combination thereof.

The RF module 110 may be controlled by a first modem or a second modem.

Alternatively, the RF module 110 may be controlled by processors, that is, a first processor or a second processor.

The central unit 200 may include an access point (AP) 210.

The access point 210 may be connected to the plurality of remote units 100 and one or more devices 310, 320 and 330 located in the vehicle.

The access point 200 may provide data based on the received signals received through the plurality of remote units 100 to one or more devices located in the vehicle.

Meanwhile, the access point 200 and the modem 120 may exchange signals, information or data through a digital interface.

Referring to FIG. 2, each of the plurality of remote units 100 may include the RF module 110 and the first modem 120.

The above description is applicable to the RF module 110.

The first modem 120 may be implemented at L1 (Layer 1, e.g., a physical layer), L2 (Layer 2, e.g., a MAC layer), a radio resource control (RRC) layer, or a non-access stratum (NAS) layer.

The first modem 120 may perform phase locked loop (PLL) control. For example, the first modem 120 may perform phase locked loop control through automatic frequency compensation control.

Phase clocked loop control means that the RF module 110 is controlled in order to constantly maintain the frequency of an output signal.

The first modem 120 may perform automatic gain control.

Automatic gain control means that gain is controlled such that output is constant even when input is changed in the RF module 110.

The first modem 120 may calculate an automatic gain control value.

The first modem 120 may control the amplifier of the RF module 110 based on the automatic gain control value.

For example, the first modem 120 may measure a received signal strength indicator (RSSI) of the RF module 110. The first modem 120 may calculate the automatic gain control value based on the measured RSSI data.

The first modem 120 may perform automatic frequency compensation control.

Automatic frequency compensation control means that the PLL circuit included in the RF module 110 is controlled based on a voltage according to a signal period and an oscillation period difference.

The first modem 120 may calculate an automatic frequency compensation control value.

The first modem 120 may control the PLL circuit of the RF module 110 based on the automatic frequency compensation control value.

For example, the first modem 120 may perform synchronization of the RF module 110.

The first modem 120 may calculate the automatic frequency compensation control value based on synchronization data.

The first modem 120 may modulate a signal transmitted through the RF module 110.

The first modem 120 may demodulate a signal received through the RF module 110.

The central unit 200 may include the access point 210.

The above description is applicable to the access point 210.

Meanwhile, in new radio (NR), as communication using a high frequency band such as an mmWave band has been discussed, necessity of a 2-step transceiver for converting a baseband signal into a high frequency band through an intermediate frequency (IF) band is emerging, instead of a transceiver for directly converting a baseband signal into a high frequency band. For example, in communication using an mmWave frequency band (e.g., 28 GHz), operation of converting the baseband signal into the IF band (e.g., 8 to 10 GHz) in a first transceiver and converting the IF band into the mmWave band (e.g., 28 GHz) in a second transceiver may be performed.

Based on signal flow, an IF unit may be further included between the RF module 110 and the first modem 120.

The IF unit may be included in the remote unit 100.

The IF unit may perform frequency band conversion.

The RF module 110 may convert the frequency band.

If the IF unit is further included, the RF module 110 may convert the IF band (e.g., 8 to 10 GHz) into the mmWave band (e.g., 28 GHz) or convert the mmWave band into the IF band.

The IF unit may convert the baseband into the IF band (e.g., 8 to 10 GHz) or convert the IF band into the baseband.

The IF unit may further include a local oscillator and an IF PLL circuit.

Referring to FIG. 3, each of the plurality of remote units 100 may include an RF module 110 and the first modem 121.

The above description is applicable to the RF module 110.

The first modem 121 may be implemented at L1 (Layer 1, e.g., a physical layer).

The first modem 121 may perform phase locked loop (PLL) control. For example, the first modem 121 may perform phase locked loop control through automatic frequency compensation control.

The first modem 121 may calculate an automatic gain control value.

The first modem 121 may control the amplifier of the RF module 110 based on the automatic gain control value.

The first modem 121 may calculate an automatic frequency compensation control value.

The first modem 121 may control the PLL circuit of the RF module 110 based on the automatic frequency compensation control value.

The central unit 200 may include a second modem 205 and an access point 210.

The second modem 205 may be implemented at L1 (Layer 1, e.g., a physical layer), L2 (Layer 2, e.g., a MAC layer), a radio resource control (RRC) layer, or a non-access stratum (NAS) layer.

The second modem 205 may modulate a signal transmitted through the RF module 110.

The second modem 205 may demodulate a signal received through the RF module 110.

The second modem 205 may measure a received signal strength indicator (RSSI) of the RF module 110.

The second modem 205 may provide the measured RSSI data to the first modem 121. The first modem 121 may calculate an automatic gain control value based on the measured RSSI data.

The second modem 205 may perform synchronization of the RF module 110.

The second modem 205 may provide synchronization data to the first modem 121. The first modem 120 may calculate an automatic frequency compensation control value based on the synchronization data.

The above description is applicable to the access point 210.

Meanwhile, an IF unit may be further included between the RF module 110 and the first modem 121.

The description of FIG. 2 is applicable to the RF module 110 and IF unit.

Referring to FIG. 4, each of the plurality of remote units 100 may include an RF module 110 and a converter 130.

The above description is applicable to the RF module 110.

The converter 130 may interconvert an analog signal and a digital signal.

The converter 130 may include an analog-to-digital converter (ADC) for converting an analog signal into a digital signal and a digital-to-analog converter (DAC) for converting a digital signal into an analog signal.

The central unit 200 may include a processor 206, a second modem 206 and an access point 210.

The processor 206 may be referred to as an antenna signal processor or a multiple AGC & AFC controller.

The processor 206 may collectively control the plurality of remote units 100.

The processor 206 may collectively control the PLL circuit and amplifier of each of the plurality of remote units 100.

The processor 206 may perform phase locked loop (PLL) control. For example, the processor 206 may perform phase locked loop control through automatic frequency compensation control.

The processor 206 may calculate an automatic gain control value.

The processor 206 may calculate the automatic gain control value based on a remote unit having best gain among the plurality of remote units 100.

The processor 206 may calculate the automatic gain control value based on average received power of the plurality of remote units 100.

The processor 206 may control the amplifier of the RF module 110 based on the automatic gain control value.

The processor 206 may calculate an automatic frequency compensation control value.

The processor 206 may control the PLL circuit of the RF module 110 based on the automatic frequency compensation control value.

The second modem 206 may be implemented at L1 (Layer 1, e.g., a physical layer), L2 (Layer 2, e.g., a MAC layer), a radio resource control (RRC) layer, or a non-access stratum (NAS) layer.

The second modem 206 may measure a received signal strength indicator (RSSI) of the RF module 110. The second modem 206 may provide the measured RSSI data to the processor 201. The processor 201 may calculate an automatic gain control value based on the RSSI data.

The second modem 206 may perform synchronization of the RF module 110. The second modem 206 may provide synchronization data to the processor 201. The processor 201 may calculate an automatic frequency compensation control value based on the synchronization data.

The second modem 206 may modulate a signal transmitted through the RF module 110.

The second modem 206 may demodulate a signal received through the RF module 110.

The above description is applicable to the access point 210.

Meanwhile, an IF unit may be further included between the RF module 110 and the second modem 206.

The IF unit may be included in the remote unit 100.

For example, the IF unit may be disposed between the RF module 110 and the converter 130, based on signal flow.

For example, the IF unit may be disposed after the converter 130, based on signal flow.

The IF unit may be included in the central unit 200.

The IF unit may be disposed before the processor 201, based on signal flow.

The IF unit may be disposed between the processor 201 and the modem 206, based on signal flow.

The description of FIG. 2 is applicable to the RF module 110 and the IF unit.

Figure 5:
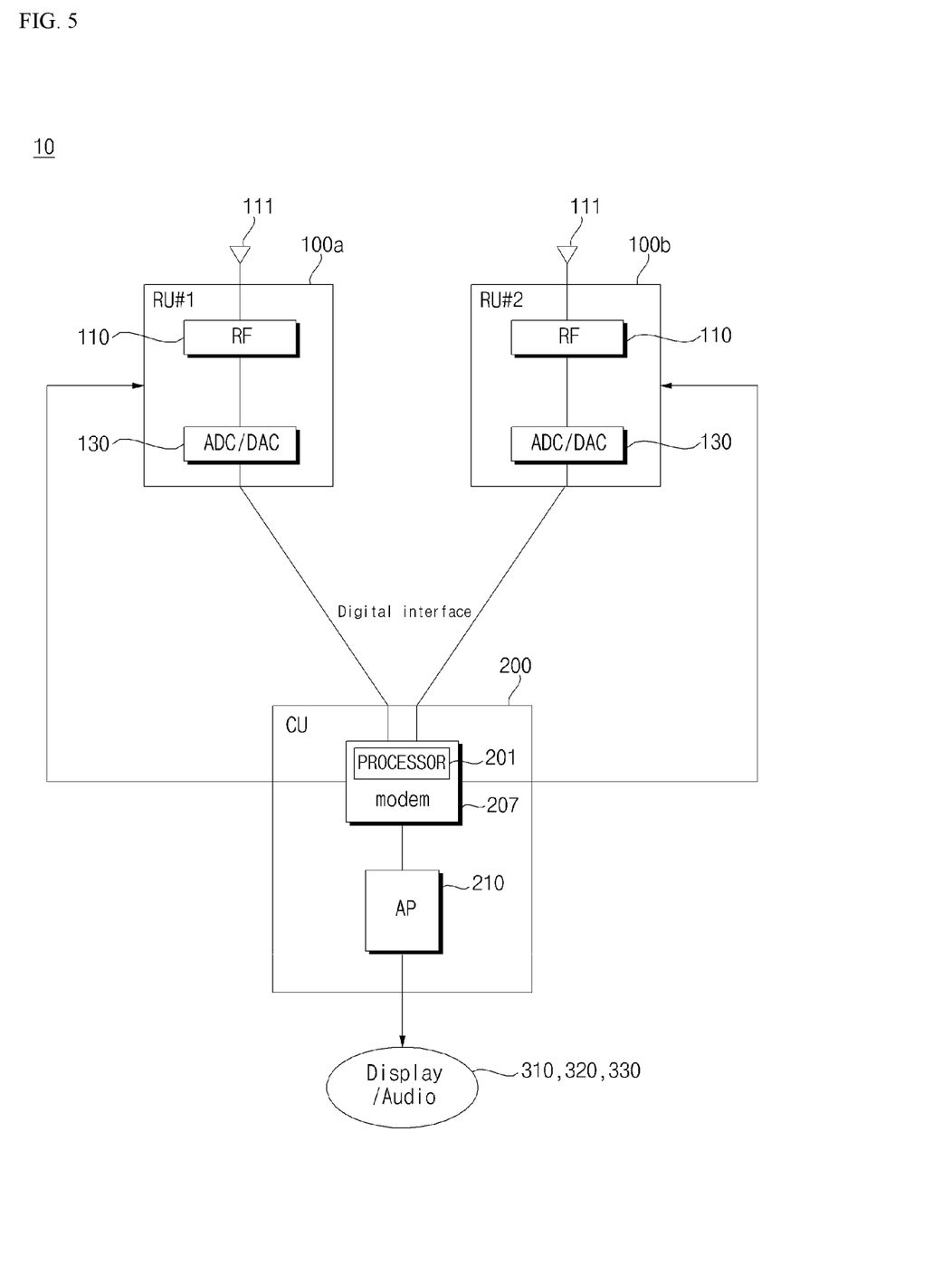
FIG. 5 is a view referenced to describe a vehicle communication apparatus according to an embodiment of the present invention.

FIG. 5 is a view referenced to describe a vehicle communication apparatus according to an embodiment of the present invention.

Figure 6:
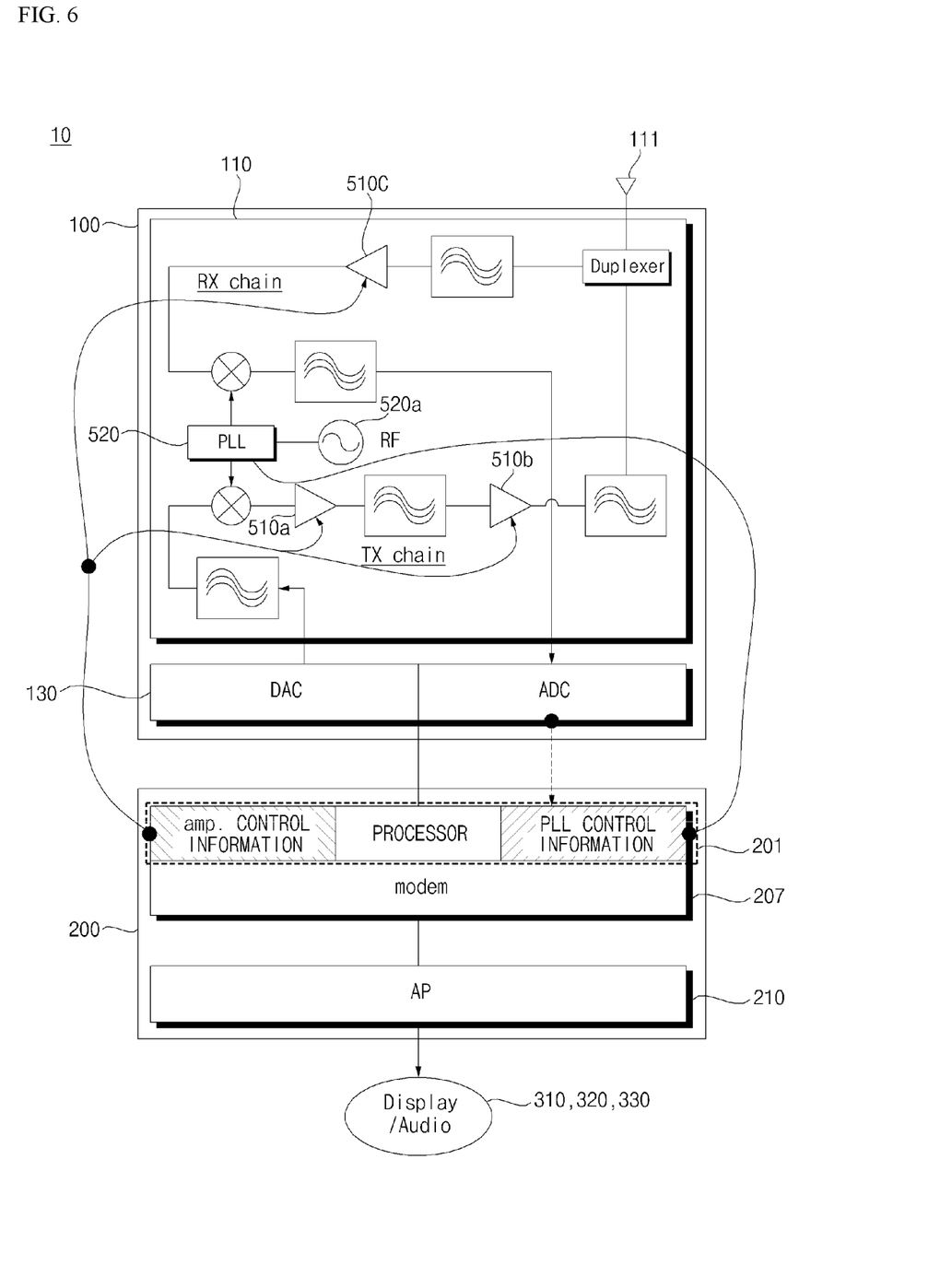
FIG. 6 is a detailed block diagram of FIG. 5.

FIG. 6 is a detailed block diagram of FIG. 5.

The description of the RF module 110 of FIG. 6 is applicable to the RF modules 110 of FIGS. 2 to 5.

Referring to FIGS. 5 to 6, each of the plurality of remote units 100 may include an RF module 110 and a converter 130.

The RF module 110 may include at least one phase locked loop (PLL) circuit 520 and at least one amplifier 510a, 510b and 510c.

The PLL circuit 520 may include an oscillator 520a.

The PLL circuit 520 may be controlled based on an automatic frequency compensation control value.

The amplifiers 510a, 510b and 510c may be controlled based on an automatic gain control value.

Although the PLL circuit 520 and the amplifiers 510a, 510b and 510c are controlled by a second modem 207 included in the central unit 200 in FIG. 6, the PLL circuit 520 and the amplifiers 510a, 510b and 510c may be controlled by the first modem 120 included in the remote unit 100, the processor included in each remote unit 100 or the processor 201 included in the central unit 200.

The central unit 200 may include a second modem 207 and an access point 210.

The second modem 207 may be implemented at L1 (Layer 1, e.g., a physical layer), L2 (Layer 2, e.g., a MAC layer), a radio resource control (RRC) layer, or a non-access stratum (NAS) layer.

The second modem 207 may collectively control the plurality of remote units 100.

The second modem 207 may collectively control the PLL circuit and amplifier of each of the plurality of remote units 100.

The second modem 207 may perform phase locked loop (PLL) control. For example, the second modem 207 may perform phase locked loop control through automatic frequency compensation control.

The second modem 207 may perform automatic gain control.

The second modem 207 may calculate an automatic gain control value.

The second modem 207 may control the amplifier of the RF module 110 based on the automatic gain control value.

For example, the second modem 207 may measure a received signal strength indicator (RSSI) of the RF module 110. The second modem 207 may calculate the automatic gain control value based on the measured RSSI data.

The second modem 207 may perform automatic frequency compensation control.

The second modem 207 may calculate an automatic frequency compensation control value.

The second modem 207 may control the PLL circuit of the RF module 110 based on the automatic frequency compensation control value.

For example, the second modem 207 may perform synchronization of the RF module 110. The second modem 207 may calculate an automatic frequency compensation control value based on the synchronization data.

The second modem 207 may modulate a signal transmitted through the RF module 110.

The second modem 207 may demodulate a signal received through the RF module 110.

The above description is applicable to the access point 210.

Meanwhile, an IF unit may be further included between the RF module 110 and the second modem 207.

The IF unit may be included in the remote unit 100.

For example, the IF unit may be disposed between the RF module 110 and the converter 130, based on signal flow.

For example, the IF unit may be disposed after the converter 130, based on signal flow.

The IF unit may be included in the central unit 200.

The IF unit may be disposed before the processor 201, based on signal flow.

The description of FIG. 2 is applicable to the RF module 110 and the IF unit.

Figure 7:
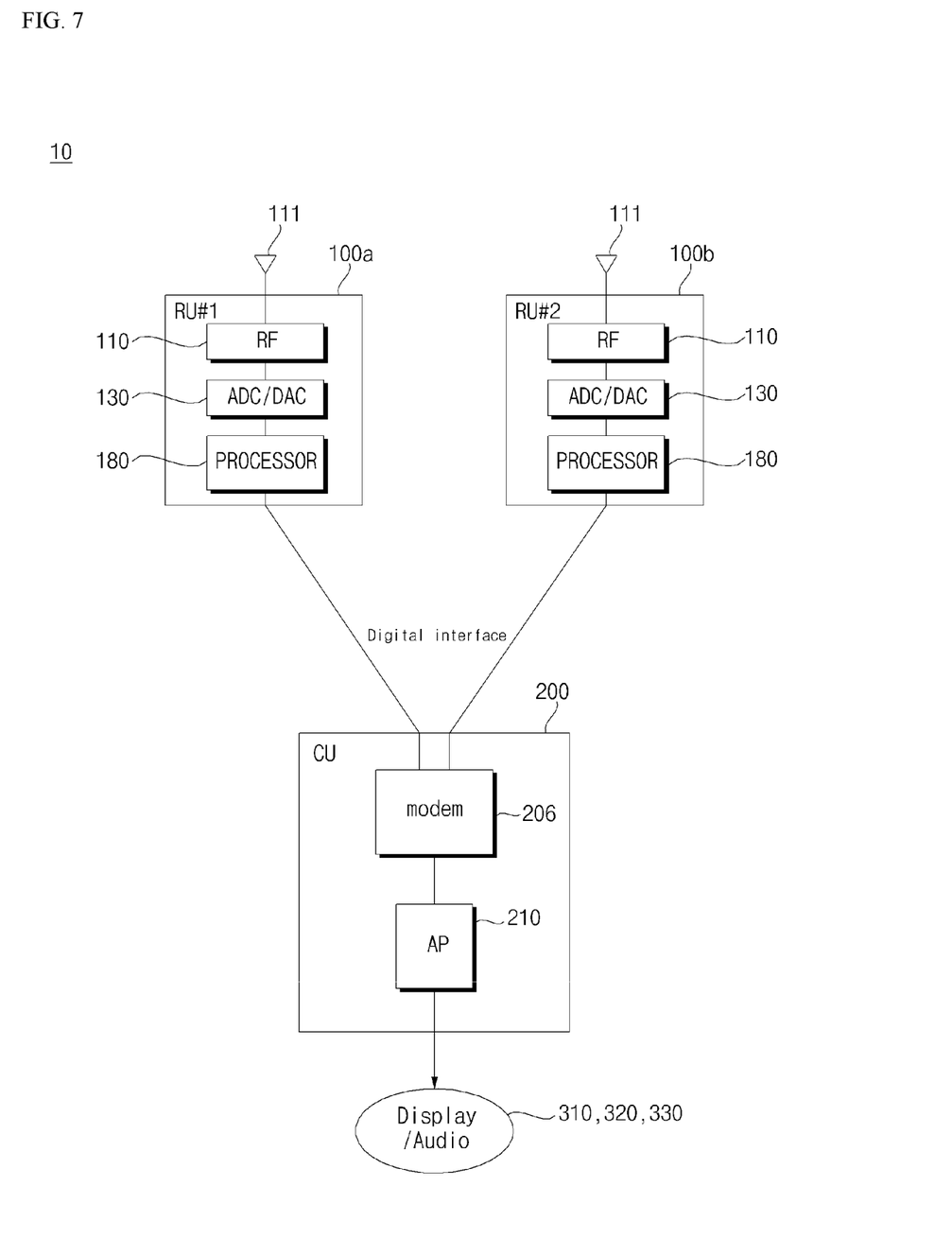
FIGS. 7 to 8 are views referenced to describe a vehicle communication apparatus according to an embodiment of the present invention.
Figure 8:
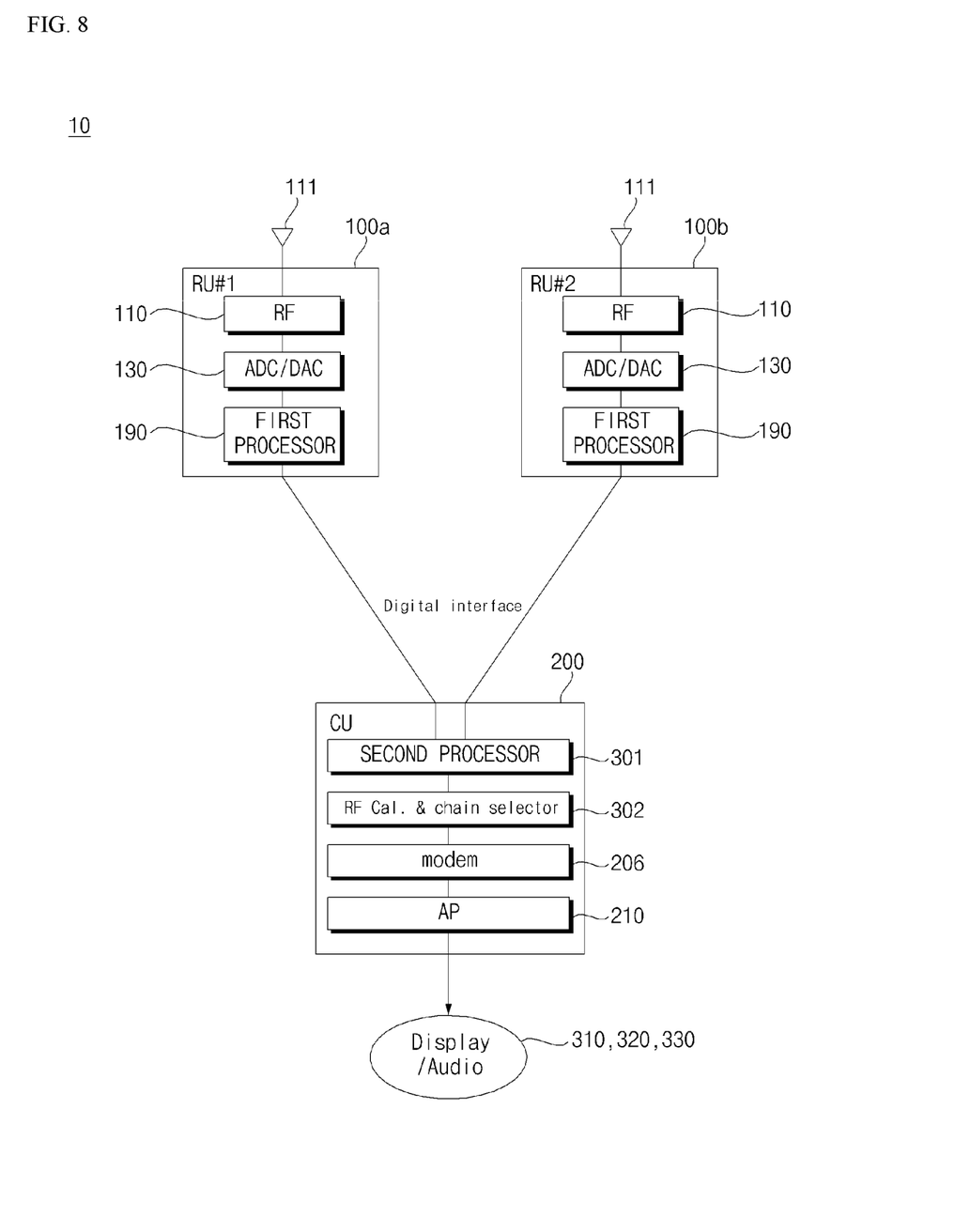

FIGS. 7 to 8 are views referenced to describe a vehicle communication apparatus according to an embodiment of the present invention.

Referring to FIG. 7, each of the plurality of remote units 100 may include an RF module 110, a converter 130 and a processor 180.

The above description is applicable to the RF module 110.

The above description is applicable to the converter 130.

The processor 180 may be referred to as an antenna signal processor or a multiple AGC & AFC controller.

The processor 180 may perform phase locked loop (PLL) control. For example, the processor 180 may perform phase locked loop control through automatic frequency compensation control.

The processor 180 may calculate an automatic gain control value.

The processor 180 may control the amplifier of the RF module 110 based on the automatic gain control value.

The processor 180 may calculate an automatic frequency compensation control value.

The processor 180 may control the PLL circuit of the RF module 110 based on the automatic frequency compensation control value.

The central unit 200 may include a second modem 206 and an access point 210.

The second modem 206 may be implemented at L1 (Layer 1, e.g., a physical layer), L2 (Layer 2, e.g., a MAC layer), a radio resource control (RRC) layer, or a non-access stratum (NAS) layer.

The second modem 206 may measure a received signal strength indicator (RSSI) of the RF module 110. The second modem 206 may provide the measured RSSI data to the processor 201. The processor 201 may calculate an automatic gain control value based on the RSSI data.

The second modem 206 may perform synchronization of the RF module 110. The second modem 206 may provide synchronization data to the processor 201. The processor 201 may calculate an automatic frequency compensation control value based on the synchronization data.

The second modem 206 may modulate a signal transmitted through the RF module 110.

The second modem 206 may demodulate a signal received through the RF module 110.

The above description is applicable to the access point 210.

Meanwhile, an IF unit may be further included between the RF module 110 and the second modem 206.

The IF unit may be included in the remote unit 100.

For example, the IF unit may be disposed between the RF module 110 and the converter 130, based on signal flow.

For example, the IF unit may be disposed between the converter 130 and the processor 180, based on signal flow.

For example, the IF unit may be disposed after the processor 180, based on signal flow.

The IF unit may be included in the central unit 200.

The IF unit may be disposed before the second modem 206, based on signal flow.

The description of FIG. 2 is applicable to the RF module 110 and the IF unit.

Referring to FIG. 8, each of the plurality of remote units 100 may include an RF module 110, a converter 130 and a first processor 190.

The above description is applicable to the RF module 110.

The above description is applicable to the converter 130.

The first processor 190 may calculate an automatic frequency compensation control value.

The first processor 190 may control the PLL circuit of the RF module 110 based on the automatic frequency compensation control value.

The first processor 190 may be referred to as an AFC controller.

The central unit 200 may include a second processor 301, a chain selector 302, and an access point 210.

The second processor 301 may calculate an automatic gain control value.

The second processor 301 may control the amplifier of the RF module 110 based on the automatic gain control value.

The second processor 301 may be referred to as an AGC controller.

The chain selector 320 may select some of a plurality of signals respectively provided to the plurality of remote units, when the number of ports of the second modem is less than the number of remote units.

For example, the chain selector 302 may select the remote units in descending order of the automatic gain control values respectively received from the plurality of remote units 100.

The chain selector 302 may provide the selected signal to the second modem 206.

The description of the second modem 206 in FIG. 7 is applicable to the second modem 206.

Meanwhile, an IF unit may be further included between the RF module 110 and the second modem 206.

The IF unit may be included in the remote unit 100.

For example, the IF unit may be disposed between the RF module 110 and the converter 130, based on signal flow.

For example, the IF unit may be disposed between the converter 130 and the first processor 190, based on signal flow.

For example, the IF unit may be disposed after the first processor 190, based on signal flow.

The IF unit may be included in the central unit 200.

The IF unit may be disposed before the second processor 301, based on signal flow.

The IF unit may be disposed between the second processor 301 and the chain selector 302, based on signal flow.

The IF unit may be disposed between the chain selector 302 and the modem 206, based on signal flow.

The description of FIG. 2 is applicable to the RF module 110 and the IF unit.

Figure 9:
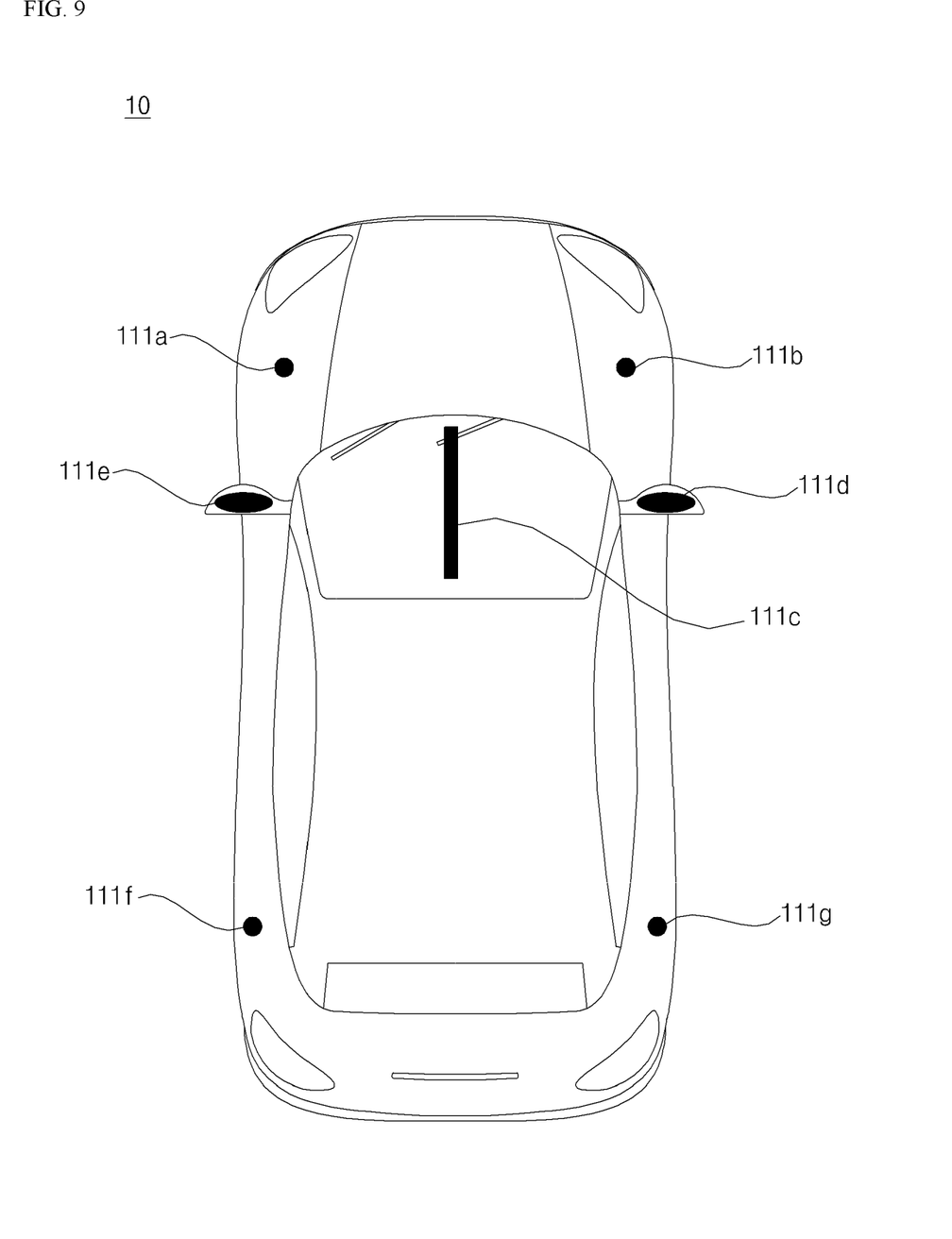
FIG. 9 is a view referenced to describe a plurality of array antennas according to an embodiment of the present invention.

FIG. 9 is a view referenced to describe a plurality of array antennas according to an embodiment of the present invention.

The vehicle communication apparatus 10 may include a plurality of array antennas 111a, 111b, 111c, 111d, 111e, 111f and 111g.

The plurality of array antennas 111a, 111b, 111c, 111d, 111e, 111f and 111g may be distributed and disposed on the upper end of the vehicle body.

For example, the array antennas may be distributed and attached to at least one of an upper end of a hood, an upper end of a roof, an upper end of a trunk, a front windshield, a rear windshield or an upper end of a side mirror.

By distributing the plurality of array antennas, it is possible to support a high data rate and high quality of service (QoS) like one large array antenna. Furthermore, it is possible to implement a multiple input multiple output (MIMO) system.

The present invention may be implemented as code that can be written to a computer-readable recording medium and can thus be read by a computer. The computer-readable recording medium may be any type of recording device in which data can be stored in a computer-readable manner. Examples of the computer-readable recording medium include a hard disk drive (HDD), a solid state drive (SSD), a silicon disk drive (SDD), a ROM, a RAM, a CD-ROM, a magnetic tape, a floppy disk, optical data storage, and a carrier wave (e.g., data transmission over the Internet). In addition, the computer may include a processor or a controller. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

The invention claimed is:

1. A vehicle communication apparatus comprising:
a plurality of remote units (RUs) configured to transmit signals to a mobile communication network and to receive signals from the mobile communication network; and
a central unit (CU) configured to provide data based on the signals received through the plurality of remote units to one or more devices located in a vehicle,
wherein each of the plurality of remote units includes an array antenna attached to a body of the vehicle and a radio frequency (RF) module including at least one amplifier, and
wherein the central unit is further configured to calculate an automatic gain control value to control the at least one amplifier based on a remote unit having a best gain among the plurality of remote units or based on an average of received power of the plurality of remote units.

2. The vehicle communication apparatus according to claim 1, wherein the RF module further includes at least one phase locked loop (PLL) circuit.

3. The vehicle communication apparatus according to claim 2, wherein the central unit includes an access point (AP) connected to the plurality of remote units and the one or more devices.

4. The vehicle communication apparatus according to claim 3, wherein each of the plurality of remote units further includes a converter configured to interconvert an analog signal and a digital signal.

5. The vehicle communication apparatus according to claim 4, wherein the central unit further includes a modem configured to modulate a signal transmitted through the RF module and to demodulate a signal received through the RF module.

6. The vehicle communication apparatus according to claim 5, wherein the central unit is further configured to calculate an automatic frequency compensation control value to control the at least one PLL circuit.

7. The vehicle communication apparatus according to claim 6, wherein the central unit further includes a processor configured to calculate the automatic gain control value to control the at least one amplifier and the automatic frequency compensation control value to control the at least one PLL circuit.

8. The vehicle communication apparatus according to claim 6, wherein the modem is further configured to calculate the automatic gain control value to control the at least one amplifier and to calculate the automatic frequency compensation control value to control the at least one PLL circuit.

9. The vehicle communication apparatus according to claim 5,
wherein each of the plurality of remote units further includes a first processor configured to calculate an automatic frequency compensation control value to control the at least one PLL circuit,
wherein the central unit further includes a second processor configured to calculate the automatic gain control value to control the at least one amplifier.

10. The vehicle communication apparatus according to claim 9, wherein the central unit further includes a chain selector configured to select and provide some of a plurality of signals respectively provided to the plurality of remote units to the modem, when a number of ports of the modem is less than a number of the plurality of remote units.

11. The vehicle communication apparatus according to claim 1, wherein the array antenna is distributed and attached to at least one of a hood, a roof, a trunk, a front windshield, a rear windshield, or a side mirror of the vehicle.

12. The vehicle communication apparatus according to claim 1, wherein the plurality of remote units are configured to receive received signals from the same external device through different frequency bands.

13. The vehicle communication apparatus according to claim 1, wherein the plurality of remote units are configured to receive received signals from the same external device through different time bands.

14. A vehicle communication apparatus comprising:
- a plurality of remote units (RUs) configured to transmit signals to a mobile communication network and to receive signals from the mobile communication network; and
- a central unit (CU) configured to provide data based on the signals received through the plurality of remote units to one or more devices located in a vehicle,
- wherein each of the plurality of remote units includes an array antenna attached to a body of the vehicle and a radio frequency (RF) module including at least one amplifier, and
- wherein each of the plurality of remote units is further configured to:
  - measure a received signal strength indicator (RSSI) of the RF module,
  - calculate an automatic gain control value to control the at least one amplifier based on based on the measured RSSI,
  - perform synchronization of the RF module, and
  - calculate the automatic frequency compensation control value based on the synchronization.

15. The vehicle communication apparatus according to claim 14, wherein the RF module further includes at least one phase locked loop (PLL) circuit.

16. The vehicle communication apparatus according to claim 15, wherein each of the plurality of remote units further includes a first modem configured to calculate the automatic gain control value to control the at least one amplifier and calculate an automatic frequency compensation control value to control the at least one PLL circuit.

17. The vehicle communication apparatus according to claim 16, wherein the first modem is further configured to modulate a signal transmitted through the RF module and demodulates a signal received through the RF module.

18. The vehicle communication apparatus according to claim 16, wherein the central unit further includes a second modem configured to modulate a signal transmitted through the RF module and to demodulate a signal received through the RF module.

19. The vehicle communication apparatus according to claim 16, wherein each of the plurality of remote units further includes:
- a converter configured to interconvert an analog signal and a digital signal; and
- a processor configured to calculate the automatic gain control value to control the at least one amplifier and calculate the automatic frequency compensation control value to control the at least one PLL circuit.

* * * * *